USOO5637519A

United States Patent [19]
Tsai et al.

[11] Patent Number: 5,637,519
[45] Date of Patent: Jun. 10, 1997

[54] METHOD OF FABRICATING A LIGHTLY DOPED DRAIN THIN-FILM TRANSISTOR

[75] Inventors: Hsiung-Kuang Tsai, Taipei Hsien; Sheng-Kai Hwang, Hsin Chu Hsien, both of Taiwan

[73] Assignee: Industrial Technology Research Institute, Hsin-Chu, Taiwan

[21] Appl. No.: 620,020

[22] Filed: Mar. 21, 1996

[51] Int. Cl.⁶ ................................................. H01L 21/265
[52] U.S. Cl. ...................... 438/160; 430/319; 430/312; 438/163
[58] Field of Search ................ 437/41 TFT, 40 TFT, 437/21, 44, 229; 430/311, 313, 319, 312

[56] References Cited

U.S. PATENT DOCUMENTS

| | | | |
|---|---|---|---|
| 4,715,930 | 12/1987 | Diem | 437/101 |
| 4,720,736 | 1/1988 | Takafuji et al. | 357/23.7 |
| 4,788,157 | 11/1988 | Nakamura | 437/46 |
| 5,010,027 | 4/1991 | Possin et al. | 437/41 |
| 5,075,237 | 12/1991 | Wu | 437/2 |
| 5,130,263 | 7/1992 | Possin et al. | 437/40 |
| 5,403,761 | 4/1995 | Rha | 437/40 |
| 5,449,637 | 9/1995 | Saito et al. | 437/57 |
| 5,518,940 | 5/1996 | Hodate et al. | 437/41 |
| 5,543,342 | 8/1996 | Mukai et al. | 430/311 |

*Primary Examiner*—Charles L. Bowers, Jr.
*Assistant Examiner*—Lynn A. Gurley

[57] ABSTRACT

A method of fabricating a lightly doped drain thin-film transistor having an inverted staggered structure is disclosed. The transistor has a glass substrate and a gate formed by a Cr layer on the substrate. An insulating layer and a semiconductor layer are deposited on the substrate and the gate. A first photo-resist layer is coated on top of the semiconductor layer. Back-side exposure and self-aligned technique are used to form an unexposed area slightly smaller than the gate area with high energy light. Low energy ion implantation is then performed on the exposed semiconductor layer to produce the lightly doped region. After removing the first photo-resist layer, another photo-resist process including a second photo-resist coating, back-side exposure and self-aligned technique is performed to form an unexposed area slightly larger than the gate area with low energy light. High energy ion implantation is then performed on the exposed semiconductor layer. The twice photo-resist processes and ion implantation processes result in a lightly doped drain.

5 Claims, 3 Drawing Sheets

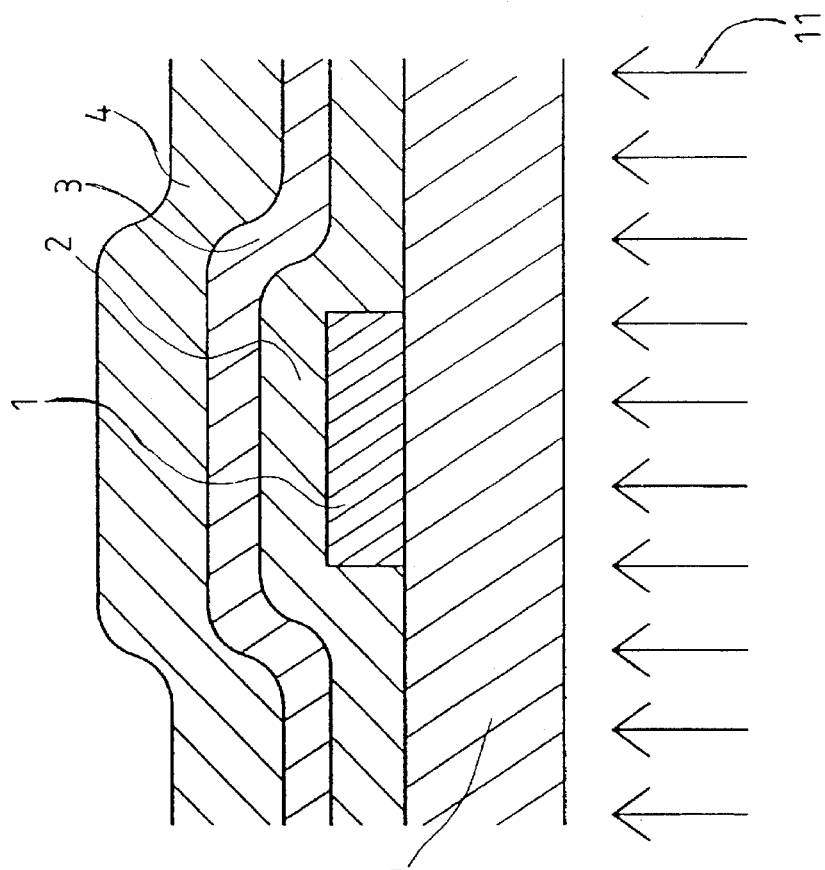

METHOD OF FABRICATING A LIGHTLY DOPED DRAIN THIN-FILM TRANSISTOR

FIELD OF THE INVENTION

The present invention relates to a method of fabricating a thin-film transistor (TFT), more specifically to a method of manufacturing a thin-film transistor having a lightly doped drain (LDD).

BACKGROUND OF THE INVENTION

Thin-film transistors have been commonly used in static random access memory devices (SRAM) and active matrix liquid crystal displays (AMLCD). Methods of fabricating thin-film transistors have been actively researched. Using self-alignment technique in fabricating thin-film transistors is desirable because it ensures that the channel gap between the source and the drain electrodes is optimized and is substantially uniform. Hayden et al. disclosed a self-aligned thin-film transistor in U.S. Pat. No. 5,235,189 issued on Aug. 10, 1993. Possin et al. disclosed a self-aligned thin-film transistor having reduced end leakage in U.S. Pat. No. 5,241,192, issued on Aug. 31, 1993 and its fabrication method in U.S. Pat. No. 5,324,674, issued on Jun. 28, 1994. A method of fabricating a self-aligned thin-film transistor with a lift-off technique was disclosed by Kwasnick et al. in U.S. Pat. No. 5,391,507, issued on Feb. 21, 1995. Rha presented a different thin-film transistor having self-aligned diffused source and drain regions to improve the ratio of on to off current and the method of fabricating such a transistor in U.S. Pat. No. 5,403,761, issued on Apr. 4, 1995.

Various ongoing developments have been dedicated to improving the switching speed, decreasing the loading current or to increase the dynamic range of thin-film transistors. As an example, Zhao et al. presented a technique of fabricating vertical submicron polysilicon thin-film transistors without using submicron lithographic equipment in a paper entitled "A Vertical Submicron Polysilicon Thin-Film Transistor Using A Low Temperature Process" in IEEE Electron Device Letters, vol. 15, No. 10, Oct. 1994.

A lightly doped drain can reduce the electric field in the area near the drain of a thin-film transistor device. Consequently, the loading current of the device can be decreased. A method of fabricating thin-film transistors having lightly doped drains was disclosed by Manning et al. in U.S. Pat. No. 5,334,862, issued on Aug. 2, 1994. A thin-film transistor having an asymmetrical lightly doped drain structure was further disclosed by Chae in U.S. Pat. No. 5,442,215, issued on Aug. 15, 1995. Process including lightly doped drain technique has been commonly used in the thin-film transistors of a CMOS device manufacturing process with silicon wafer substrate. Such a thin-film transistor is usually top-gated which has a source, a drain and a channel region that are formed underlying a gate region. The structure is co-planar. In AMLCD, however, an inverted staggered structure that has a source, a drain and a channel region formed overlying a gate region is often adopted for the thin-film transistor that has a glass substrate. When a polysilicon thin-film transistor having lightly doped drain is manufactured for the inverted staggered structure, the off-current of the transistor is normally too large.

SUMMARY OF THE INVENTION

The present invention has been made to overcome the above-mentioned problem. An object of this invention is to present an inverted staggered structure for the thin-film transistor having a lightly doped drain and a glass substrate. The lightly doped drain can reduce the electric field of the drain and provide a low off-current for the thin-film transistor.

Another object of this invention is to provide a fabrication process using self-aligned and back side exposure technique for manufacturing the thin-film transistor on a glass substrate.

According to the present invention, a layer of Cr film is deposited on a glass substrate to form a gate. An insulating layer and a semiconductor layer are then deposited on the gate and the substrate. A self-aligned back side exposure technique and a high energy light source are applied in the photo-resist process using the gate as the mask to form an unexposed area slightly smaller than the gate area. Low energy ion implantation is then performed on the exposed area to lightly dope the semiconductor layer.

A similar photo-resist process is then applied to form an unexposed area slightly larger than the gate area. The exposed semiconductor layer is then processed and heavily dope by high energy ion implantation. After removing the photo-resist, the conventional photo-lithographic technique is used to form an island area including the un-doped semiconductor layer, the lightly doped region and the heavily doped region, a drain, and a source for the thin-film transistor.

BRIEF DESCRIPTION OF THE DRAWINGS

FIG. 1 shows the cross-sectional view of the glass substrate, the Cr gate, the insulating layer and the semiconductor layer of an unfinished thin-film transistor device of this invention.

FIG. 2 illustrates the coating of a photo-resist layer on the device in FIG. 1 and the back-side exposure using gate as a self-aligned mask.

DETAILED DESCRIPTION OF THE PREFERRED EMBODIMENTS

Figure 4:
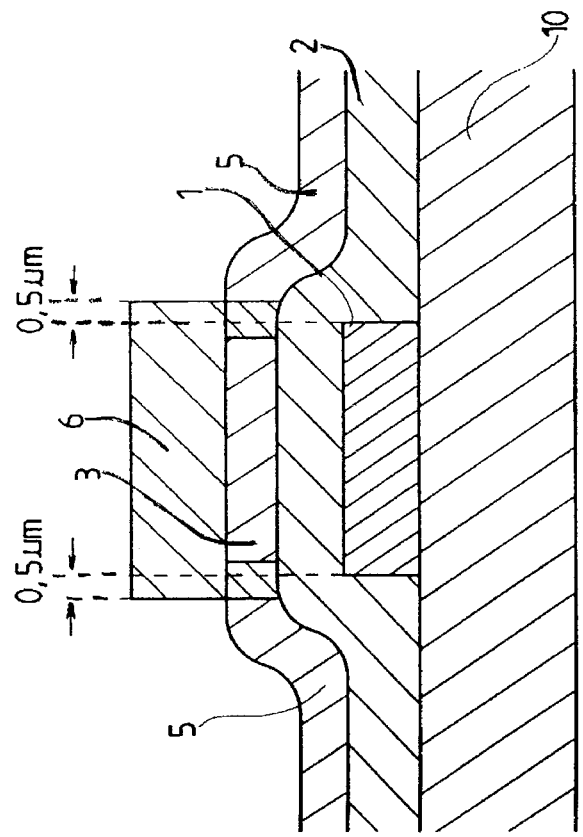
FIG. 4 shows an unexposed photo-resist area slightly larger than the gate area after the device in FIG. 3 has been processed by a second self-aligned back side exposure and photo-resist development.

With reference to FIG. 1, a glass substrate 10 is used as the starting substrate of the thin-film transistor. A layer of Cr film is first deposited on the substrate to form a gate 1. The thickness of the Cr film is from 1500 Angstroms to 2500 Angstroms and preferably 2000 Angstroms. An insulating layer 2 followed by a semiconductor layer 3 are then deposited on the gate 1 and the substrate 10 using chemical vapor deposition (CVD) process. The thickness of the semiconductor layer is about 300 Angstroms. It can be from 200 to 600 Angstroms.

An un-doped polysilicon layer may be directly deposited on the insulating layer 2 and the gate 1 to form as the semiconductor layer 3. Alternatively, amorphous silicon may be formed as the semiconductor layer 3 by re-crystallizing the amorphous silicone into polysilicon by use of any known anneal process. The anneal process may be performed by either a laser beam annealing or a thermal treatment.

As shown in FIG. 2, a layer of positive photo-resist 4 of 1.5 µm thickness is coated on top of the semiconductor layer 3. Back side exposure technique by using ultra-violet light 11 is used to expose the photo-resist 4 with the gate 1 serving as a self-aligned mask. A high energy light source of approximately 1000 mj/cm$^2$ is used to over expose the photoresist 4.

Figure 3:
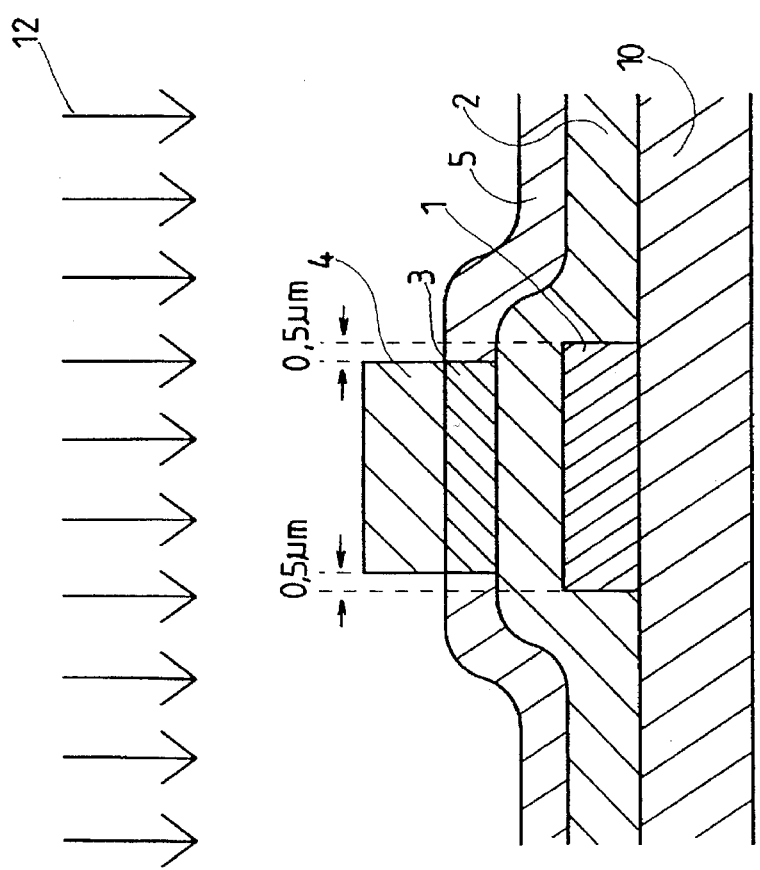
FIG. 3 shows an unexposed photo-resist area slightly smaller than the gate area and the process of low ion implantation after the photo-resist layer of the device in FIG. 2 has been developed.

After the development, the width of the unexposed area of the polysilicon layer 3 is slightly smaller than that of the gate area by about 0.5 µm on each side as shown in FIG. 3. Low energy ion implantation 12 is then performed to form the lightly doped region $N^{-5}$. After the formation of the $N^-$ region, the photo-resist layer 4 is removed. Another new photo-resist layer is again coated on top of the semiconductor layer 3 and over the insulating layer 2.

Figure 5:
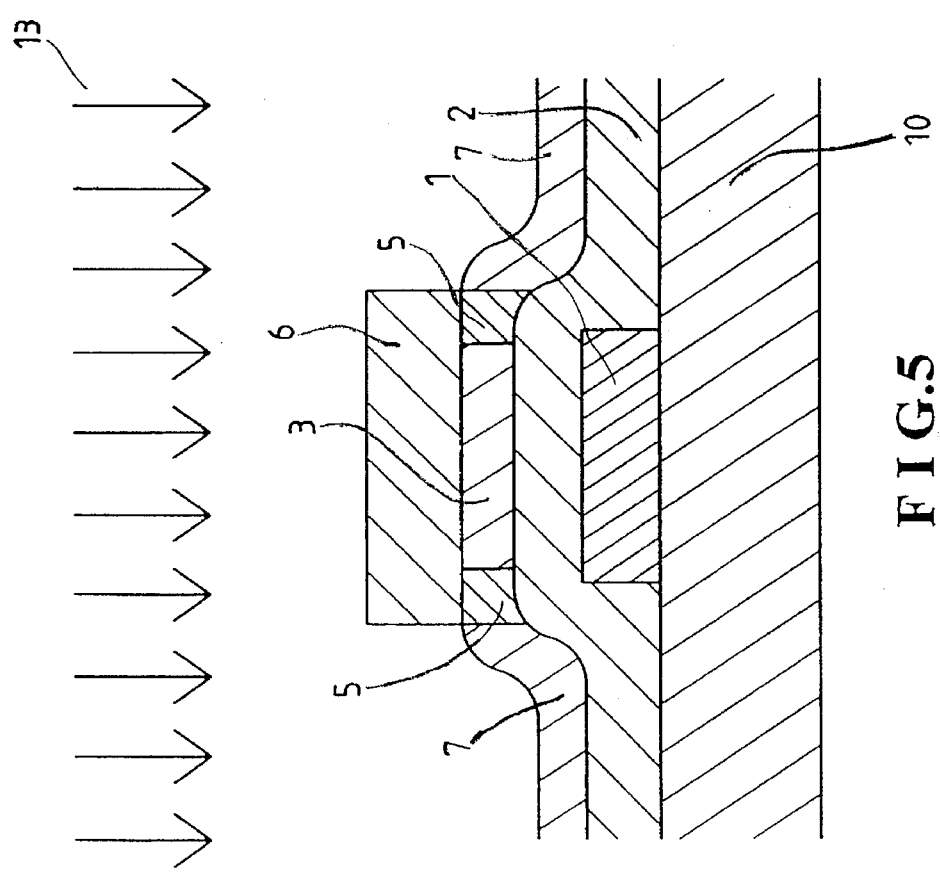
FIG. 5 illustrates high energy ion implantation on the device shown in FIG. 4.

A second process of self-aligned back side exposure is performed to expose the photo-resist using the gate 1 as a mask. The light energy used in the exposure is about 800 mj/cm$^2$. The lower light energy results in slightly under exposure. Therefore, the width of the unexposed area 6 is slightly larger than the gate area 1 by approximately 0.5 µm on each side as shown in FIG. 4. High energy ion implantation 13 as shown in FIG. 5 is then performed to produce the heavily doped region $N^+$ 7. It can be understood that the twice photoresist processes form the lightly doped region $N^{-5}$ that has about 1 µm (0.5+0.5 µm) width on each side of the unexposed area of the semiconductor layer 3. The photo-resist 6 layer is removed after the ion implantation.

Figure 6:
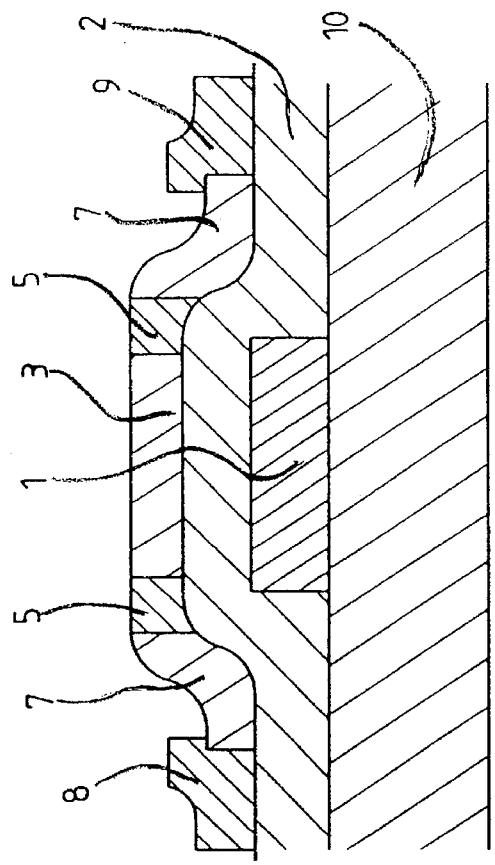
FIG. 6 shows the finished thin-film transistor having an inverted staggered structure of this invention.

Finally, the conventional photo-lithographic process is used to remove part of the heavily doped semiconductor layer and form an island area, a source 8 and a drain 9 as illustrated in FIG. 6. The island area includes the semiconductor layer 3, the low energy ion implantation area $N^-$ 5 and the high energy ion implantation area $N^+$ 7. Both the source and the drain cover a part of the heavily doped region and are extended outward to cover a part of the insulating layer. The inverted staggered structure of the thin-film transistor having a lightly doped drain is thus completed as shown in FIG. 6. The existence of 6he lightly doped region $N^-$ 5 results in decreasing the off-current of the thin-film transistor. It has been demonstrated that the off-current can be lower than 1 pA.

Although only the preferred embodiments of this invention were shown and described in the above description, it is requested that any modification or combination that comes within the spirit of this invention be protected.

What is claimed is:

1. A method of fabricating a lightly-doped drain thin-film transistor comprising the steps of:

preparing a glass substrate;

forming a gate area on a portion of said glass substrate;

depositing an insulating layer above said gate area and said glass substrate;

depositing a semiconductor layer over said insulating layer;

forming a first photo-resist layer on said semiconductor layer;

exposing said first photo-resist layer using said gate area as a self-aligned mask with a back-side exposure technique to slightly over expose said first photo-resist layer;

developing said first photo-resist layer to form a first unexposed area slightly smaller than said gate area;

establishing a lightly doped region in said semiconductor layer outside said first unexposed area on each side of said gate area;

removing said first photo-resist layer from said first unexposed area;

forming a second photo-resist layer on said semiconductor layer and the insulating layer;

exposing said second photo-resist layer using said gate area as a self-aligned mask with a back-side exposure technique to slightly under expose said second photo-resist layer;

developing said second photo-resist layer to form a second unexposed area slightly larger than said gate area;

establishing a heavily doped region in said semiconductor layer outside said second unexposed area on each side of said gate area;

removing said second photo-resist layer from said second unexposed area;

forming an island area by removing the outer portion of said semiconductor layer using a conventional photo-lithographic method, said island area comprising the first unexposed area, the lightly doped area, and the heavily doped area; establishing a drain above one end of said island area, said drain covering a portion of said heavily doped area and extending above said insulating layer; and forming a source above an opposite end of said island area, said source covering a portion of said heavily doped area and extending above said insulating layer.

2. The method of fabricating a lightly-doped drain thin-film transistor according to claim 1, wherein an ion implantation process having sufficient energy for lightly doping said semiconductor layer is used for establishing said lightly doped region in said semiconductor layer outside said first unexposed area on each side of said gate area.

3. The method of fabricating a lightly-doped drain thin-film transistor according to claim 1, wherein an ion implantation process having substantial energy, for heavily doping said semiconductor layer is used for establishing said heavily doped region in said semiconductor layer outside said second unexposed area on each side of said gate area.

4. The method of fabricating a lightly-doped drain thin-film transistor according to claim 1, comprising the step of depositing an un-doped polysilicon layer to form as the semiconductor layer.

5. The method of fabricating a lightly-doped drain thin-film transistor according to claim 1, comprising the step of re-crystallizing an amorphous silicon into polysilicon by means of an anneal process or thermal treatment to form as the semiconductor layer.

* * * * *